Nov. 1, 1966 R. L. GARWIN 3,283,168

MULTI-LAYERED CRYOGENIC SWITCHING DEVICES

Filed Sept. 15, 1958

3 Sheets-Sheet 1

INVENTOR
RICHARD L. GARWIN

BY John E. Dougherty Jr.
ATTORNEY

Nov. 1, 1966 R. L. GARWIN 3,283,168

MULTI-LAYERED CRYOGENIC SWITCHING DEVICES

Filed Sept. 15, 1958

3 Sheets-Sheet 2

United States Patent Office 3,283,168
Patented Nov. 1, 1966

3,283,168
MULTI-LAYERED CRYOGENIC SWITCHING DEVICES

Richard L. Garwin, Scarsdale, N.Y., assignor to International Business Machines Corporation, New York, N.Y., a corporation of New York Filed Sept. 15, 1958, Ser. No. 761,085
14 Claims. (Cl. 307—88.5)

The present invention relates to switching devices and, more specifically, to cryogenic switching devices of the type which are particularly adapted for use in electronic and electrical computers.

Probably the best known of the present day cryogenic switches is the cryotron which is a device for gating or switching current and comprises a gate conductor fabricated of superconductive material and a control conductor arranged in magnetic field applying relationship to the gate conductor. The gate conductor is maintained at a temperature at which it is superconductive in the absence of a magnetic field and is selectively driven into a resistive state by applying magnetic fields under the control of current applied to the control conductor. The cryotron-type devices, heretofore developed, may be divided into two classes, the wire wound type shown and described in U.S. Patent 2,832,897, issued on April 29, 1958, to D. A. Buck, and the thin film type shown and described in copending application, Serial No. 625,512, filed November 30, 1956, and assigned to the assignee of the subject application. In each of these devices, the control and gate conductors are so arranged that the field produced by current in the gate conductor is at right angles to the field produced by current in the control conductor. As a result, there is always a component of the gate field which adds to the control field regardless of the direction in which the gate and control currents are flowing. This addition of fields limits the actual gain which can be achieved with devices of this type, since, though the gain characteristics of such cryotrons may be enhanced by employing a biasing magnetic field, at least a component of the bias field in devices of this type adds to the field produced by current in the gate and, therefore, limits the amount of current which can be carried by the gate without it being driven resistive. A further characteristic of devices of the prior art type is that the minimum field required to be produced by the control conductor in order to drive the gate conductor resistive varies in accordance with the magnitude of the current in the gate conductor.

Cryogenic switching devices have also been developed for gating or modulating the transmission of magnetic energy between two conductors. Examples of such devices are shown and described in copending application Serial No. 687,225, now Patent No. 2,914,735, and 705,598, now Patent No. 3,007,057 filed, respectively, on September 30, 1957, and December 27, 1957, and assigned to the assignee of the subject application. In these devices a superconductive shield is disposed so that it is effective when in a superconductive state to prevent the transmission of signals between an input and output conductor. The shield is selectively driven resistive to allow signals to be transmitted between the input and output conductors. In the devices of the prior art, the shield is usually mounted in close proximity to the input and output conductors and the entire shield or a large portion thereof is, itself, driven resistive in order to modulate the transmission signals between the input and output conductors.

In accordance with the principles of the subject invention, applicant has provided a cryogenic switch of the cryotron type in the form of a device which includes a gate conductor and two control conductors, one of which may be employed as a bias conductor. These conductors are disposed in essentially parallel spaced relationship so that the greater portion of the field produced by current in any one of the conductors either adds to or subtracts from the field produced by current in the other two conductors, in accordance with the direction of current in the conductors. Further, the arrangement of the conductors is such that the control conductors are not subject to the field produced by current in the gate conductor and one of the control conductors is not subject to the field produced by current in the other control conductor. When one of the control conductors is employed as a bias conductor, the arrangement is such that the bias and control current flow in one direction and the gate current in the opposite direction so that the bias and control fields add and both of these fields oppose the gate field in the vicinity of the gate conductor. In this way, cryotrons having high gain characteristics may be fabricated, and further, the value of current in the control conductor necessary to drive the gate conductor resistive is independent of the current being carried by the gate conductor. Also in accordance with the principles of the subject invention, applicant has provided an improved cryogenic magnetic switch which employs a shield of superconductive material which is connected in a completely superconductive loop to control the transmission of magnetic energy between an input and output conductor. When the loop is entirely superconductive, the input and output conductors are shielded one from the other. However, though the shield itself always remains superconductive, its shielding properties may be destroyed by selectively driving a portion of the loop in which it is connected into a resistive state and the portion of the loop which is driven resistive may be located at a point which is physically remote from both the shield and the input and output conductors.

Therefore, a principal object of the present invention is to provide improved cryogenic switching devices.

A further object is to provide improved cryogenic switching devices of the cryotron type having high gain characteristics.

Still another object is to provide an improved biased cryotron.

Another object is to provide a biased cryotron wherein the bias field aids the control field in the vicinity of the gate.

Another object is to provide an improved cryogenic gating device of the cryotron type which includes a plurality of conductors which are arranged in parallel spaced relationship so that the fields produced by current in any one of these conductors either adds to or subtracts from the field produced by current in one or more of the other conductors at predetermined locations only in the vicinity of at least one of the gate conductors.

A further object is to provide an improved cryogenic device for gating the transmission of magnetic energy between an input and output conductor.

Another object is to provide an improved cryogenic magnetic gating device of the type which employs a closed loop of a superconductive material for controlling the transmission of energy between an input and an output conductor.

Still another object is to provide a magnetic gating device of the above described type wherein the transmission of signals between the input and output conductors is controlled by controlling the state, superconductive or normal, of a portion only of the superconductive loop which is physically remote from the input and output conductors.

These and other objects of the invention will be pointed out in the following description and claims and illustrated in the accompanying drawings, which disclose, by way of examples, the principle of the invention and the best mode, which has been contemplated, of applying that principle.

Figure 1:
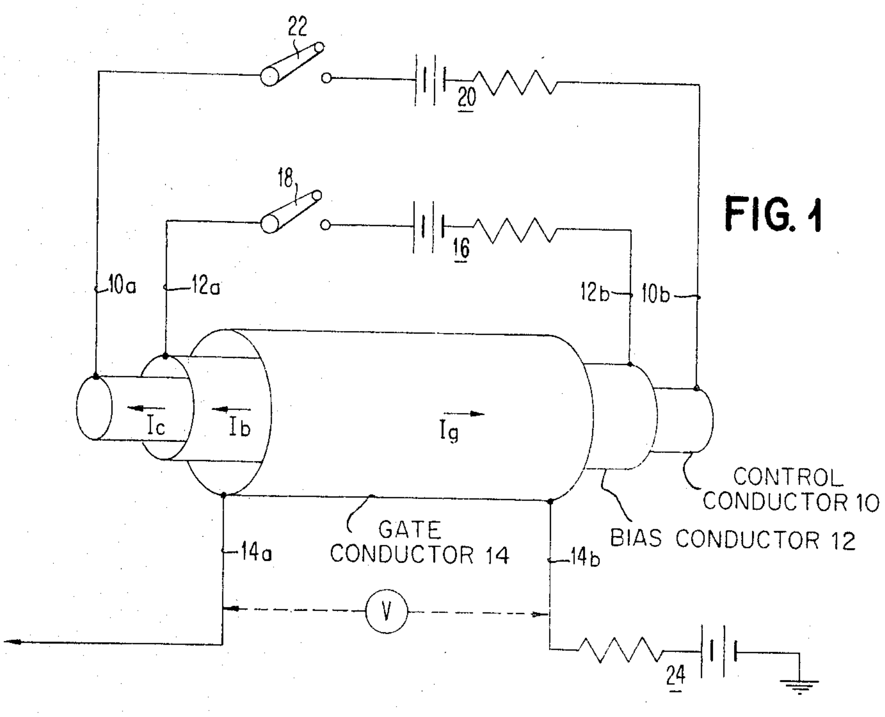
FIGURE 1 is a diagrammatic representation of a magnetic switching device in the form of a biased cryotron constructed in accordance with the principles of the invention.

Referring now to the drawings in detail and, more specifically, to the schematic circuit diagram of FIG. 1, the reference numerals 10, 12, and 14 there designate the three cylindrical conductors which are the basic components of a cryogenic gating device in the form of a biased cryotron constructed in accordance with the principles of the invention. The inner cylindrical conductor 10 is a control conductor for the cryotron; the intermediate cylindrical conductor 12 is a bias conductor; and the outer cylindrical conductor is a gate conductor. Control conductor 10 is connected by a pair of leads 10*a* and 10*b* in a circuit with a current source 20, illustratively represented by a battery and resistor, which supplies control current $I_c$ to this conductor under the control of a switching device, here schematically represented by mechanically operated switch 22. Bias conductor 12 is similarly connected by a pair of leads 12*a* and 12*b* in a circuit with a current source 16 which supplies to the bias conductor a bias current $I_b$ under the control of a switching device 18. Gate conductor 14 receives current $I_g$ from a source 24 to which it is connected by a lead 14*b*. The gate current circuit is completed by a further lead 14*a* which may be connected directly to a superconductive ground when, for example, the output of the device is taken by way of a voltage developed between leads 14*a* and 14*b*. However, in most cases, the cryotron is used to gate current in a circuit including a number of other devices and the conductor 14*a* is connected between one or more superconductive components such as the control conductors for other cryotrons to a superconductive ground.

Each of the conductors 10, 12, and 14 is fabricated of superconductive material, the particular materials employed being dependent upon the operating temperature of the circuit. However, regardless of the operating temperature, the bias conductor 12 is preferably fabricated of a hard superconductive material, and the gate conductor 14 of a soft superconductive material. The terms hard and soft superconductors are relative, the former indicating a superconductor having a relatively high critical field at the operating temperature and the latter indicating a superconductor having a relatively low critical field at the operating temperature. The control conductor 10 is preferably fabricated of a hard superconductor material and may, for example, be fabricated of the same material as the bias conductor 12, but for reasons that will appear as the description progresses, the control conductor may, under certain conditions, be a soft superconductor fabricated of the same material as the gate conductor 14. Thus, for example, if the device is to be operated at a temperature of 4.2° K., the temperature at which liquid helium boils at atmospheric pressure, the gate conductor would be fabricated of tantalum having, for example, a critical field at this temperature of about 100 oersteds. The gate conductor might also be fabricated of tin, in which case the operating temperature would be below 3.7° K., which is the temperature at which tin undergoes transitions between resistive and superconductive states in the absence of a magnetic field. At either of the above operating temperatures, the control and bias conductors might be fabricated of niobium or lead, both of which materials have critical fields greatly in excess of 100 oersteds at these temperatures.

When the device of FIG. 1 is operated as a biased cryotron, switch 18 remains in a closed position so that source 16 causes a bias current to continuously flow in conductor 12. The magnitude of this bias current is such that the magnetic field which it produces and which is applied to the cylindrical gate conductor 14 is less than the critical field for the gate conductor. Though this field is not of itself sufficient to drive the gate conductor resistive, it decreases the current necessary to be supplied to the control conductor 10 to produce at the surface of the gate conductor a field sufficient to cause this conductor to be driven into a resistive state. This is due to the fact that the fields produced by currents in the bias and control conductors are in the same direction since the current in these conductors is in the same direction. Therefore, with the use of a bias current of proper magnitude, it is possible to cause the gate conductor 14 to be driven into a resistive state with a relatively small control current applied by source 20 under control of switch 22 to the control conductor 10. However, since, as is indicated by the arrows $I_b$ and $I_g$, the bias current is in an opposite direction to the gate current, these currents produce fields in the vicinity of the gate conductor 14 which are in opposite directions. As a result, the current required in the gate conductor to cause the gate conductor to be driven into a resistive state is much greater than would be the case if the biasing magnetic field were not present. As a result of the construction shown with the control and bias currents flowing in one direction and the gate current in the other direction, the cryotron device of FIG. 1 exhibits a gain which is greater than unity, that is, a small current applied to the control conductor 10 is effective to control a larger current in the gate conductor 14. This is an important and desirable characteristic of cryotron devices since it is usual to connect these devices in circuits in which the current in the gate of one cryotron is directed to the control conductor of another cryotron, and such operation is not possible unless the individual devices exhibit gain.

Figure 2:
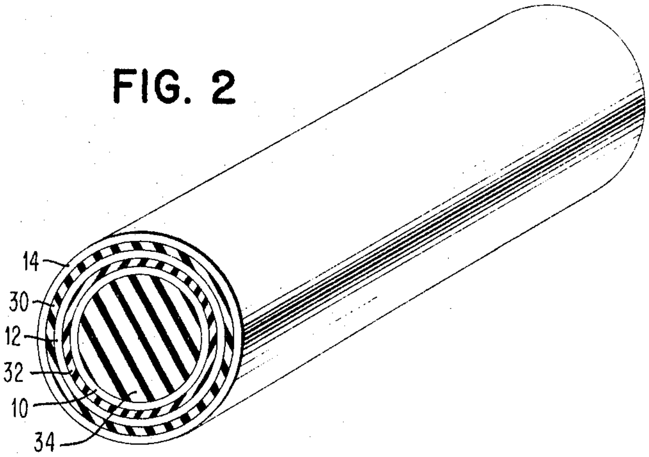
FIGURE 2 is a more specific showing of the manner in which the device of FIG. 1 may be fabricated.

The gain characteristics of this device, as well as its basic principles of operation, may be better understood by making reference to FIG. 2, which is a more accurate representation of the manner in which the improved cryotron, schematically represented in the circuit diagram of FIG. 1, may actually be constructed. As shown in FIG. 2, the cylindrical conductors 10, 12, and 14 are separated by thin layers of insulating material 30 and 32, and the entire structure is supported on an insulating core 34. The device may be fabricated using evaporation techniques with the core 34 being used as the initial substrate. The inner conductor 10 is first evaporated using a hard superconductor material such as lead; then the insulating film 32, which may, for example, be silicon monoxide, is evaporated; thereafter, the hard superconductor bias conductor 12, the insulating layer 30, and, finally, the soft superconductor gate conductor 14, which may, for example, be tin, are successively evaporated. Each of the superconductive films 10, 12, and 14, as well as the insulating films 30 and 32, are relatively thin, for example, in the order of 10,000 Angstroms, and, as indicated in the drawing, the radius of the insulating core 34 is preferably large compared to the thickness of the evaporated films.

Each of these films 10, 12, and 14 is in the form of a cylinder, and it is a characteristic of cylindrical conductors that current through such a conductor does not produce any magnetic field within the cylinder but only a field around the outer surface of the cylinder, which field is proportional to the radius of the cylinder. The intensity of the magnetic field produced by longitudinal current in any one of the cylindrical conductors at any point external to that conductor is given by the relationship, $$H=\frac{2I}{10r}$$

where H represents the magnetic field intensity; I represents the current in the cylinder; and $r$ represents the radial distance from the axis of the cylinder. Therefore, current in any one of the cylindrical conductors produces a magnetic field which is zero within that conductor, which is most intense adjacent the outer surface of the conductor and which decreases in intensity as the distance from the outer surface increases. Here, however, since the three cylindrical conductors are coaxial, the magnetic field produced at a point external to all three cylinders, for example, at the outer surface of the gate conductor 10, is the same for a given unit of current in any one of the cylindrical conductors.

The above principles in mind, it should be apparent that a current in the inner cylinder 10, which is the control conductor, produces a magnetic field adjacent its own outer surface and adjacent both the inner and outer surfaces of the cylindrical bias and gate conductors 12 and 14; a current in the bias conductor 12 produces a magnetic field adjacent its own outer surface and adjacent both the inner and outer surfaces of the gate conductor 14; and a current in the gate conductor 14 produces a magnetic field adjacent its own outer surface only. Further, for the configuration shown, with the radius of core 34 large compared to the thickness of the films of insulating and conductive material, the magnetic fields produced by current in any one of the conductors may, for ease of illustration, be considered to be of uniform intensity, though it is, of course, understood that the field intensity actually decreases as the distance from the current carrying conductor increases. Based upon this simplification, the field applied to both the inner and outer surfaces of gate 14, when there is a unit of current in either the control conductor 10 or bias conductor 12, is considered to be of the same intensity and to be equal to the intensity of the field at the surface of the conductor carrying the current which produces the field.

Referring again to the schematic circuit diagram of FIG. 1 with the above described principles in mind, it should be apparent that, since the gate current is in a direction opposite to that of the control and bias currents, the intensity of the magnetic field at the outer surface of the gate conductor 14 is, for all conditions of operation, given by the relationship, $$H_g=\frac{2(I_b+I_c-I_g)}{10r_g}$$

where $H_g$ represents the intensity of the field applied to the gate conductor 14; $I_c$, $I_b$, and $I_g$ represent the current in the control conductor 10, bias conductor 12, and gate conductor 14, respectively; and $r_g$ represents the radius of the cylindrical gate conductor 14. The usual way of representing the gain of cryotron devices is by the ratio, $I_{go}/I_{co}$, where $I_{co}$ is the current required in the control conductor to produce a field of sufficient intensity to drive the gate conductor resistive when there is no current in the gate conductor; and $I_{go}$ is the self current in the gate conductor which causes this conductor to be driven resistive when there is no current in the control conductor. Here, however, a bias current is continuously applied to bias conductor 12, thereby causing the gate conductor 14 to be continuously subjected to a biasing magnetic field. This biasing magnetic field is in the same direction as the field produced when there is a current $I_c$ in the control conductor 10 and is in the opposite direction to the magnetic field produced when there is a gate current $I_g$ in the gate conductor 14. Since the three conductors are coaxial, the intensity of the magnetic field applied to the gate conductor 14 is the same for a unit of current in any one of these conductors alone. Therefore, the current in the gate conductor 14, which is of itself sufficient to cause that conductor to be driven resistive and is termed the Silsbee current for the gate conductor, may be idealistically considered to be equal to the current in either the bias or control conductor, which is of itself sufficient to cause a field in excess of its critical field to be applied to the gate conductor. This current value is here termed $I_o$ and, again, since the cylindrical conductors are coaxial, the gate will be driven resistive when the algebraic sum of the currents in the three conductors exceeds this value of current.

The term idealistically is used above, since it has been found that the actual Silsbee current for various superconductive samples may, in many cases, be less than that which would be theoretically expected, based upon the assumption that it is actually the magnetic field produced by this current which causes the superconductor to undergo a transition to a normal or resistive state. However, the theoretical explanation which is based upon this assumption and the further assumption that the gate conductor is homogeneous throughout and is free of strains and impurities is considered to be sufficiently accurate to properly illustrate the principles of the invention.

Therefore, with a bias current continuously applied to conductor 12 and no current in the control conductor 10, the field applied to the gate conductor 14, when there is a current $I_g$ in the gate, is proportional to the algebraic sum of these two currents, that is, $I_b-I_g$. Under these conditions, the gate conductor 14 is driven resistive when the magnitude of this term $(I_b-I_g)$ is equal to or greater than the critical current $I_o$. The critical current in the gate conductor $I_{go}$ is, thus, equal to $I_b+I_o$. Similarly, with bias current $I_b$ in conductor 12 and no current in gate conductor 14, the magnitude of the current required in the control conductor to cause the gate conductor to be driven resistive, that is, $I_{bo}$, is equal to $I_o-I_b$. Therefore, the gain of the cryotron, $I_{go}/I_{co}$, may be represented by the ratio $I_o+I_b/I_o-I_b$. This gain, which, theoretically, in all cases should exceed unity, increases as the magnitude of the bias current $I_b$ is increased. However, for conventional circuit applications, the bias current should be less than the critical current value $I_o$, since, if it exceeds this value, the gate conductor 14 will be in a resistive state when it is not carrying current.

It was stated during the description of the manner in which the cryotron of FIGS. 1 and 2 might be fabricated that the control and bias conductors 12 and 14 are preferably hard superconductors. These conductors, therefore, remain in a superconductive state when the magnetic fields produced by currents therein are sufficient to drive the soft superconductor material of the gate conductor 14 into a resistive state. It was also noted that the control conductor 10 may be fabricated of a soft superconductor material such as that used in fabricating the gate conductor 14. Such a construction is possible because of the fact that the only field to which this conductor is subjected is the field produced by its own self current. This field produced by current in the control conductor need not be, of itself, of sufficient intensity to drive the gate conductor 14 resistive. Therefore, for very thin films of the type described above and represented illustratively in FIG. 2, the intensity of the magnetic field produced by current in the control conductor 10 is not appreciably greater at the surface of this conductor than it is adjacent the surfaces of the gate conductor 14. Control conductor 10 may, therefore, be fabricated of the same superconductor material as the gate conductor 14, and this control conductor may be capable of carrying a current pulse which is ineffective to produce a sufficient field to drive the control conductor resistive but which, together with the biasing magnetic field, is sufficient to drive the gate conductor 14 resistive.

It might be supposed that since the cylindrical bias conductor 12, which always remains in a superconductive state and physically separates the control conductor 10 and gate conductor 14, would serve as a magnetic shield which would prevent fields produced by current in the control conductor from being applied to the gate conductor. However, the shielding properties of superconductor materials are dependent upon inducing in the particular superconductor material, by an applied field, a current which, in turn, produces a field which is equal to and opposite to the applied field. The shielding property is dependent upon the characteristic of the superconductive state whereby it is not possible to change the net flux threading a loop of superconductive material unless resistance is introduced in the loop. When current pulses are applied to the control conductor 10 of FIG. 1, thereby developing a magnetic field linking bias conductor 12, a current will be induced in the latter conductor. However, the induced current flows longitudinally alongside the cylinder, and the only return path for the current, outside of the cylinder 12 itself, is through the circuit including the constant current source 16 and switch 18. This is not a superconductive loop, and the source 16 serves to maintain the current in the bias conductor 12 at a constant value so that the bias conductor does not serve to shield the control conductor from the gate conductor. The same is true, of course, when switch 18 is open, in which case there is no return path for longitudinal current induced in the cylinder 12 except within the cylinder itself.

Figure 2A:
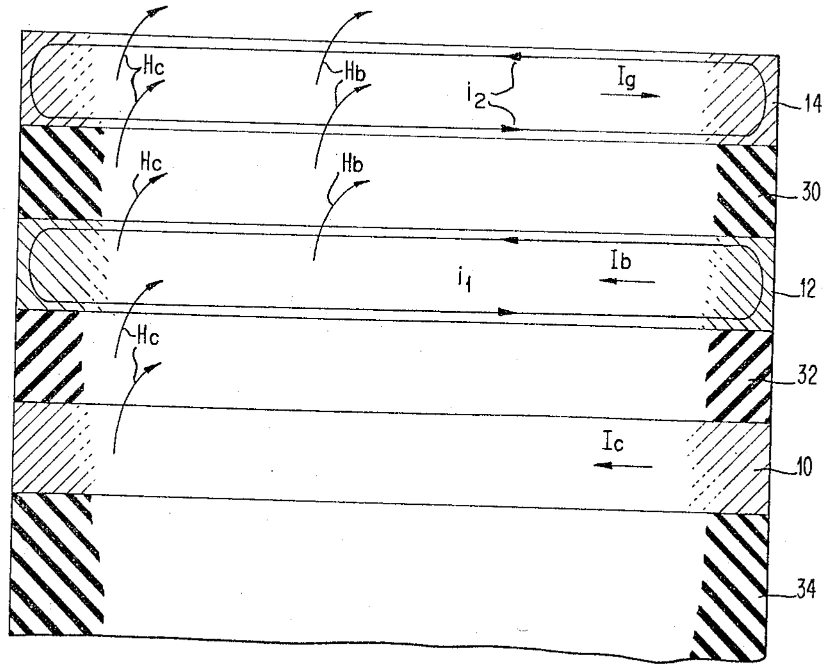
FIGURE 2A is an enlarged and somewhat exaggerated longitudinal section of a portion of the device shown in FIG. 2.

An understanding of why the conductor 12 does not serve as a magnetic shield, and also of the actual magnetic field distribution for the entire cryotron device under various conditions of operation may be had from a consideration of FIG. 2A. In this figure, there is shown a longitudinal cross section of the upper portion of the biased cryotron device of FIG. 2 in which the thickness of the cylindrical conductors 10, 12, and 14, and of the insulating layers 30, 32, and 34 is greatly exaggerated in order to more clearly illustrate the current and magnetic field distribution within the cylindrical conductors. In FIG. 2A, the arrows $H_c$ represent the magnetic field produced by the control current $I_c$ and the arrows $H_b$ represent the magnetic field produced by the bias current $I_b$. As noted before, the only magnetic fields produced by these currents are external to the conductors in which they flow and, for the direction of current $I_b$ and $I_c$ shown, the magnetic fields produced are in a direction such that they point into the paper in FIG. 2A. The field $H_c$ produced by control current $I_c$ attempts to penetrate the superconductive bias conductor 12. However, the cross section of the bias conductor 12 actually forms a closed loop, or circuit path, of superconductive material and, in accordance with the characteristics of the superconductive state, it is not possible to change the net flux threading a completely superconductive loop. Therefore, a loop current $i_1$ is established in the superconductive cylinder 12. This current flows in one direction adjacent the inner surface of the cylindrical conductor and returns in the opposite direction along the outer surface. The direction and magnitude of this current $i_1$ is such as to produce a magnetic field within the loop in which it flows and this field is equal and opposite to that portion of the field $H_c$ which passes through cylinder 12. As a result the net magnetic field in the superconductive material of cylinder 12 remains unchanged. The current $i_1$ does not, however, produce a field which serves to shield conductor 10 from conductor 14 since, at all points external to the outer surface of cylinder 12, the field produced by the current $i_1$ flowing in one direction adjacent the outer surface of cylinder 12 cancels the field produced by the current $i_1$ flowing in the opposite direction along the inner surface of this cylindrical conductor. Therefore, gate cylinder 14, in the absence of the gate current $I_g$, is subject both to the field produced by the bias current $I_b$ and the field produced by the control current $I_c$.

When there is no current $I_g$ in gate conductor 14, the combined field, $H_b$ and $H_c$, exceeds the critical field for the gate conductor and, therefore, the gate conductor is driven resistive. When there is no current in the control conductor 10, and there is a current $I_b$ in the bias conductor 12 and a current $I_g$ in the gate conductor 14 in the directions indicated, the gate current $I_g$, since the gate conductor is entirely superconductive, flows in a thin shell on the outer surface of the cylinder. The thickness of this shell in which the gate current flows is equal to the penetration depth of the superconductive material at the operating temperature. This gate current $I_g$ does not produce any magnetic field within the cylindrical shell in which it flows. Therefore, at the inner surface of the gate conductor, the only field present is the bias field $H_b$ and this field is, for conventional cryotron operation, insufficient, of itself, to drive this portion of the gate conductor resistive. This field, in attempting to penetrate the superconductive loop formed by the gate cylinder, induces a loop current $i_2$ which maintains the net field in the superconductive material within the loop unchanged. Since the field produced by the gate current exists only external to the innermost portion of the gate cylinder in which the gate current is flowing, the gate field and bias field combine only in the outer portion of the gate cylinder and external to the surface of the gate cylinder. Because of the fact that the currents $I_b$ and $I_g$ flow in opposite directions, the fields produced by these currents are in opposition and the outer surface of the gate cylinder also remains superconductive even for relatively large values of gate current. Note should here be made of the fact that the loop current $i_2$ flowing adjacent the outer surface of the gate 14 is in a direction opposite to the direction in which the gate current $I_g$ flows, thereby enhancing the Silsbee current characteristics of the gate under these operating conditions.

When under the conditions above described, that is with both gate and bias current present, a control current $I_c$ is applied to control conductor 10, the combined fields $H_c$ and $H_b$ exceed the critical field of the gate conductor. These fields oppose the field produced by the gate current $I_g$, but, regardless of the depth at which the gate current is flowing in the gate conductor $I_g$, there is always a portion of the gate conductor adjacent its inner surface in which there is no field produced by the gate current. This is so since there cannot be any magnetic field produced by the gate current within the cylindrical shell in which it is flowing. Therefore, in the inner surface of the gate conductor and in the adjacent portions extending outwardly to and including the innermost portion in which the gate current $I_g$ is flowing, the only fields present are the fields $H_b$ and $H_c$ which, in combination, exceed the critical field for the superconductive material of the gate conductor and, therefore, drive these portions of the gate conductor into a resistive state. As the gate conductor is thus driven resistive from the inner surface outward, the gate current, which always seeks a superconductive path, is forced outward and, with it, the field produced by the gate current until the entire gate cylinder 14 is driven resistive by the combined bias and control fields. When this occurs, the gate current tends to distribute uniformly in the gate cylinder thereby producing a magnetic field in opposition to the bias and control fields in a portion of the gate cylinder and at the outer surface of the gate cylinder. The net field at these points is reduced below the critical field so that portions of the gate cylinder may revert to a superconductive state. However, as soon as a completely superconductive path is available in the gate cylinder, the current $I_g$ is directed into that path and thereafter the above described phenomenon is repeated; that is, the superconductive path in which the gate current is flowing is subjected only to the bias and control fields $H_b$ and $H_c$, and this section of the gate cylinder is, therefore, immediately driven resistive. The gate conductor 14 is under these conditions of operation in, which is termed, the intermediate state.

One extremely useful property of the above device is that the total field which must be produced by current in the bias and control conductors in order to drive the gate conductor into a resistive state is essentially independent of the current in the gate conductor. Thus, with a given value of bias current $I_b$ in the bias conductor, the magnitude of the current $I_c$ which must be supplied to the control conductor 10 to cause the gate conductor 14 to be driven resistive in the same regardless of whether or not there is any gate current flowing in the gate conductor. The device, therefore, may be utilized as a high gain cryotron in circuits of the type which employ two or more cryotron gates connected in parallel. The functional operation and the gain achievable are the same both in circuit applications wherein the current to be gated is not applied until all but one of the cryotron gates is driven resistive, and in applications wherein the current is switched from one gate to the other by applying a control current to the control conductor for the cryotron gate in which the current is initially flowing.

It should also be pointed out that the function of the inner and middle cylindrical conductors 10 and 12 of FIG. 1 may be interchanged, that is, a bias current may be continuously supplied to the inner conductor 10 and control pulses selectively applied to the middle conductor 12. When cylinder 12 serves as a control conductor, it is still necessary that it be fabricated of a hard superconductor material if, as is the usual case, it is desired, or even necessary, for this operation of the circuit in which the improved cryotron is used that the control conductor always remain in a superconductive state. The operation is the same regardless of which of the two conductors 10 or 12 is the control and which is the bias conductor; the gate 14 remains in a superconductive state when subjected only to the field produced by current in the bias conductor and is selectively driven into a resistive state when, under these conditions, a control pulse is applied to the control conductor.

It should also be noted that the device of FIG. 1 may be also operated as an AND circuit. In such a case, the switches 18 and 22 are normally open but are individually operable to apply pulses to cylinders 10 an 12, respectively. The pulses applied to the associated conductor when either of these switches is closed may, for example, be equal to $0.6I_0$ so that, when either switch is operated exclusively, gate 14 remains superconductive but, when both switches are closed simultaneously, the gate conductor is driven into a resistive state. Since it is not necessary that switches 18 and 22 be closed simultaneously to cause the gate conductor 14 to be driven resistive, the circuit of FIG. 1 may also be used as a conventional gating circuit. In such an application, the inputs to be gated may, for example, be applied to the inner cylinder 10 under control of switch 22; the control or gating signals are applied to conductor 12 under control of switch 22; and the outputs are manifested by the state, resistive or superconductive, of gate 14.

Figure 5:
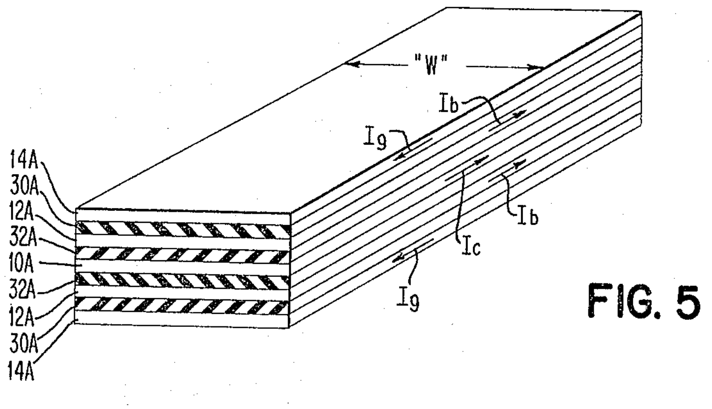
FIGURE 5 shows a further embodiment illustrating the manner in which devices capable of operating in accordance with the principle of the invention may be constructed using planar thin films.

The improved gating device may also be fabricated in planar form, as shown in the embodiment of FIG. 5. In this figure, designations corresponding to those in FIG. 2, with the letter A appended, are employed to identify corresponding functional components. The gating device of FIG. 5 is fabricated by successively evaporating the number of planar films of superconductive or insulating material. These films may be evaporated on an insulating substrate (not shown) or, preferably, in order to reduce the inductance of the current carrying components forming the gating device, the substrate may be in the form of a hard superconducting shield on which there is first evaporated a film of insulating material. An example of a cryotron device mounted on a hard superconductor shield and a discussion of the advantages of such an arrangement are included in copending application Serial No. 625,512, filed November 30, 1956, in behalf of the inventor of the subject invention and assigned to the assignee of the subject invention. In the embodiment of FIG. 5, the outer two layers 14A are fabricated of a soft superconductor material and serve as the gate conductor for the device and carry gate current in the direction indicated $I_g$. Layers 30A are insulating layers and separate the gate conductor 14A from two layers of hard superconductor material 12A which carry bias current in the direction indicated by arrow $I_b$. Layers 32A are also insulating layers and these layers separate the bias conductor 12A from the center film or layer 10A which is fabricated of a hard superconductor material and which carries control current in the direction indicated by arrow $I_c$. In order that the field and current distribution and, therefore, the operation of the device be similar to that of the device shown in FIGS. 1 and 2 the width "W" of superconductive layers 10A, 12A and 14A is much greater than the distance between these layers, that is, the thickness of insulating layers 30 and 32. Bias current may be continuously applied to bias conductor 12A to generate a magnetic field in the vicinity of gate conductor 14A, which is of itself insufficient to cause the gate conductor to undergo a transition from a superconductive to a resistive state. However, when a control current is applied to the control conductor 10A, the total magnetic field applied to gate conductor 14A is sufficient to drive that conductor into a resistive state. Further, as in the embodiments of FIGS. 1 and 2, the function of the conductors 10A and 12A may be interchanged so that bias current is continuously supplied to conductor 10A and control current selectively applied to conductor 12A. Gain is achieved in the device of FIG. 5 since, as in the previously described embodiments, the magnetic field produced by the bias current is in the same direction as the magnetic field produced by the control current and is in an opposite direction to the magnetic fields produced by gate current. The device of FIG. 2 may also be used as an AND circuit or as a conventional gating device, in either of which cases current pulses are selectively applied to both of the conductors 10A and 12A to control the state, superconductive or resistive, of gate conductor 14A. It should be noted that, as in the embodiments of FIGS. 1 and 2, none of the superconductive films 10A, 12A, or 14A are connected in closed superconducting loops so that these films do not serve as magnetic shields in the applications described above.

Mention was made above of the fact that it is a characteristic of the superconductive state that the net flux threading a closed loop of superconductive material cannot be changed as long as all portions of the loop remain in a superconductive state. This is due to the fact that, as magnetic field is applied to either attempt to increase or decrease the flux threading such a loop, a current is induced in the loop in a direction to produce a flux in a direction opposite to the applied field. Because of the fact that the superconductive material forming the loop exhibits zero resistance, the current induced in the loop continues as long as the applied field is maintained and the field produced by the current induced in the loop is essentially equal in intensity to the applied field and in the opposite direction.

Figure 3:
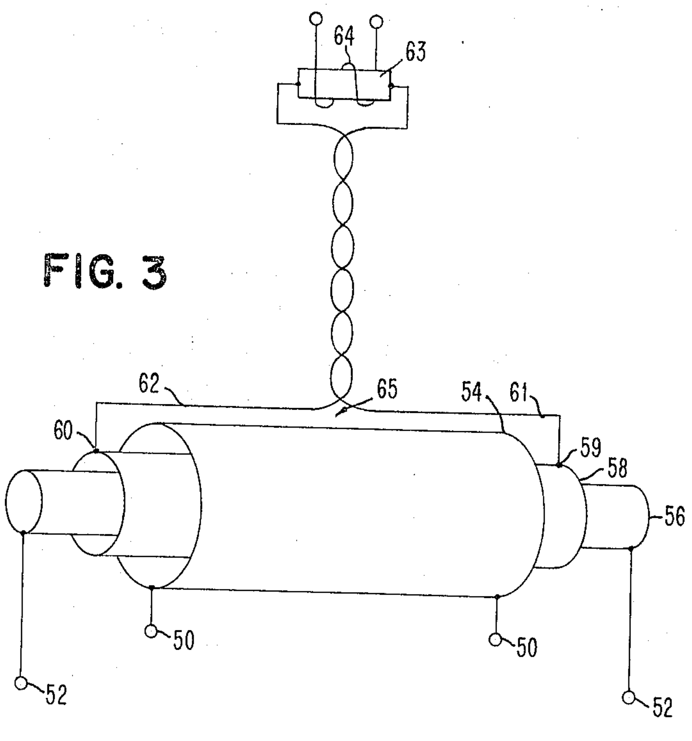
FIGURE 3 is a diagrammatic representation of one embodiment of a cryogenic magnetic switching device constructed in accordance with principles of the invention.

This phenomenon may be utilized in fabricating magnetic gating devices as is illustrated in FIG. 3, which shows an improved magnetic switch which is constructed in accordance with the principles of the subject invention. In this figure, the cylindrical conductors forming the switch are schematically illustrated to simplify the showing of circuit connections but, as shown in FIG. 2 described above, it is preferable that each of the circuits be fabricated of a thin film separated from the adjacent cylinders by a thin layer of insulating material so that the cylinders differ very little in their radii. In the embodiment of FIG. 3, inputs are applied to a pair of terminals 52 which are connected to the opposite ends of the inner cylinder here designated 56. These inputs produce a current in the inner cylinder which, in turn, generates a magnetic field which links both the middle and outer cylinders here designated 58 and 54, respectively. This field tends to induce in both of these cylinders 54 and 58 a longitudinal current which, ignoring for a moment the shielding effect of cylinder 58 and the circuit in which it is connected, will induce an output in outer cylinder 54 which is manifested at a pair of terminals 50. However, the middle cylinder 58 is provided at its opposite end with a pair of terminals 59 and 60 to which there are connected a pair of leads 61 and 62. These leads are superconductive and are connected to the opposite ends of a superconductor element 63 which may be the gate of a conventional cryotron and which is normally in a superconductive state at the operating temperature of the circuit. Leads 61 and 62, together with gate 63 and cylinder 58, form a closed superconductive loop which is generally designated 65. The magnetic field generated when a signal is applied between terminals 52 to produce current in cylinder 56 threads this superconductive loop and, therefore, induces in the loops a current sufficient to balance the applied magnetic field. For perfect shielding, it would be necessary that the current induced in cylinder 58 be just equal to that applied to cylinder 56. In order to approach this condition as nearly as possible, the circuit connecting terminals 59 and 60 of cylinder 58 should be of as low inductance as possible, and therefore, the leads 61 and 62 are twisted in bifilar fashion. With this arrangement, the loop 65, including cylinder 58, serves to shield the inner cylindrical conductor 56 and the outer cylindrical conductor 54 and, as long as loop 65 remains entirely superconductive, input signals applied between terminals 52 are not effective to produce any appreciable output signals at terminals 50.

The gating devices of FIG. 3 may be opened to allow transmission of signals between the input and output terminals by applying a signal to a coil 64 which is wound around gating element 63 to thereby drive the gating element resistive. With gate 63 resistive, there is no longer a completely superconductive path between terminals 59 and 60 and, therefore, cylinder 58 no longer serves as a shield between the input and output conductors 56 and 54 so that signals applied between terminals 52 are effective to produce output signals between terminals 50. It should be noted that the shield 58 always remains in a superconductive state and that the gate 63 is physically remote from the shielding cylinder 58 as well as from both the input and output cylinders 56 and 54. The signals applied to coil 64 to control the transmission of signals between input terminals 50 and output terminals 52 are not effective to induce any spurious signals in any one of the concentric cylinders.

Figure 4:
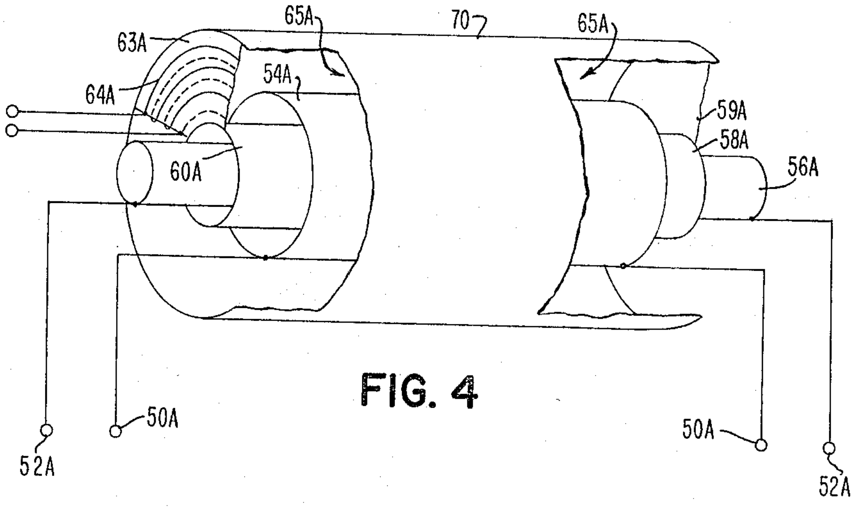
FIGURE 4 shows another embodiment of a cryogenic magnetic switching device constructed in accordance with the principles of the invention.

A further embodiment of a magnetic switch is shown in FIG. 4. This switch is similar to that of FIG. 3 and, for this reason, like designations with the letter A appended are used in FIG. 4 to identify components corresponding to those of FIG. 3. The magnetic switching device of FIG. 4 includes four concentric cylinders designated 56A, 58A, 54A, and 70. Portions of FIG. 4 are broken away to show more clearly the inner construction. The device of FIG. 4 differs from that of FIG. 3 only in the construction of the return current path connecting the terminals 59A and 60A at the opposite ends of the shielding cylinder 58A. This path is here formed by the outer cylinder 70 which is connected to the shielding cylinder 58A by a pair of superconductive strips 63A, one of which is embraced by a coil 64A which is selectively energized to drive that strip resistive when it is desired to allow signals to the transmitted between the input terminals 52A and the output terminals 50A for the circuit.

In both of the embodiments of FIGS. 3 and 4 the magnetic fields produced by current inputs to the inner conductors 56, 56A, regardless of the state of gates 63, 63A, attempt to penetrate the cross section of the intermediate superconductive conductors 58, 58A, thereby causing a loop current such as that shown at $i_1$ in FIG. 2A to be established in the intermediate cylindrical conductor. This loop flows in one direction along the inner surface of this cylinder and returns in the opposite direction along the outer surface, thereby producing a field which maintains the net field in the superconductive material unchanged. However, as pointed out above, with reference to FIG. 2A, the fields produced by these currents cancel outside the cylinder and therefore, do not affect the operation of the magnetic switch.

The magnetic switching devices of FIGS. 3 and 4 may also be fabricated in the planar form illustrated in the embodiment of FIG. 5. When the planar device of FIG. 5 is to be used as a magnetic gating device, the inner and outer layers 10A and 14A serve as the input and output conductors and the intermediate layers 12A are connected in a low inductance closed loop of superconductive material, a portion of which is selectively driven resistive to control the transmission of signals between the input and output conductors.

Figure 6:
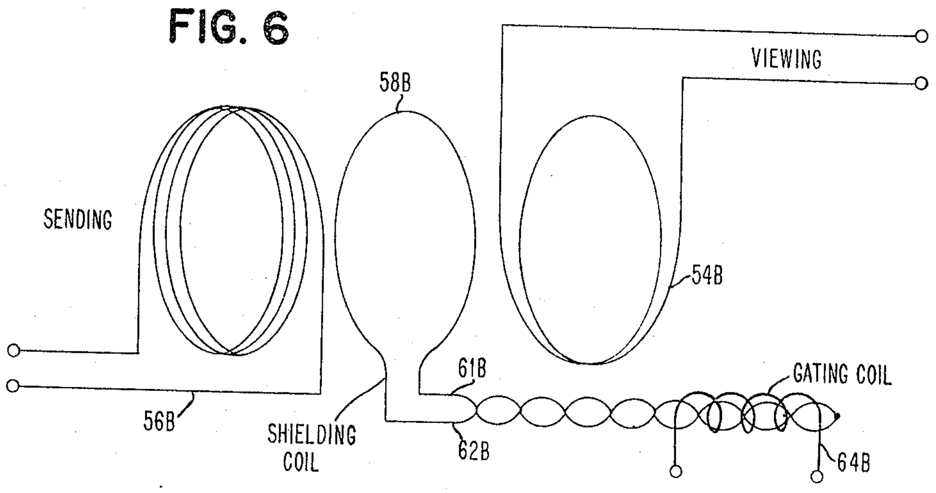
FIGURE 6 shows a further embodiment of a magnetic switching device constructed in accordance with the principles of the invention.

Still another embodiment of a magnetic switching device constructed in accordance with the principles of the subject invention is shown in FIG. 6. The device includes three coils, an input coil 56B, an output coil 54B and a shielding coil 58B which is arranged between the input and output coils. The ends of shielding coil 58B are connected by a pair of conductors 61B and 62B in a closed current loop. Shielding coil 58B and conductors 61B and 62B are fabricated of a material which is superconductive at the operating temperature of the current. Coil 58B and conductors 61B and 62B, therefore, form a superconductive loop which normally shields input coil 56B from output coil 54B. The shielding properties of the loop may be destroyed by energizing a control coil 64B which is arranged in magnetic field applying relationship to portions of the conductors 61B and 62B which are physically remote from the coils. The magnetic field applied by coil 64B quenches superconductivity in these portions of conductors 61B and 62B so that coil 58B is no longer part of a superconductive loop and signals may, therefore, be transmitted between coils 56B and 54B.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. A gating device comprising first, second, and third conductors disposed in parallel spaced relationship,
   - said second conductor being arranged within said first conductor,
   - said third conductor being arranged within said second conductor,
   - said conductors being fabricated of superconductor material and maintained at an operating temperature at which each is in a superconductive state in the absence of a magnetic field,
   - input means for said device comprising means connected to longitudinally spaced points on said third conductor for producing longitudinal current therein and thereby generating a magnetic field in the vicinity of said first conductor, said magnetic field produced by the longitudinal current in said third conductor being less than the critical field required to drive said first conductor from a superconductive to a resistive state, output circuit means for said device connected to longitudinal spaced points on said first conductor, further circuit means connected to longitudinally spaced points on said second conductor for controlling the effect of said magnetic field produced by said current in said third conductor on said first conductor, wherein said third conductor comprises a first planar layer of superconductive material, said second conductor comprises second and third planar layers of superconductive material, one on each side of said first layer, and said first conductor comprises fourth and fifth planar layers of superconductive material, one on each side of said first layer and separated from said first layer by said second and third planar layers, the width of each of said layers is large compared to the space therebetween.

2. A gating device comprising first, second, and third conductors disposed in parallel spaced relationship, said second conductor being arranged within said first conductor, said third conductor being arranged within said second conductor, said conductors being fabricated of superconductor material and maintained at an operating temperature at which each is in a superconductive material in the absence of a magnetic field, input means for said device comprising means connected to longitudinally spaced points on said third conductor for producing longitudinal current therein and thereby generating a magnetic field in the vicinity of said first conductor, said magnetic field produced by the longitudinal current in said third conductor being less than the critical field required to drive said first conductor from a superconductive to a resistive state, output circuit means for said device connected to longitudinally spaced points on said first conductor, further circuit means connected to longitudinally spaced points on said second conductor for controlling the effect of said magnetic field produced by said current in said third conductor on said first conductor, wherein said further means is fabricated entirely of superconductive material maintained at a temperature at which it is a superconductive state in the absence of a magnetic field and forms with said second conductor a closed superconductive loop, and wherein there is provided means arranged in magnetic field applying relationship to a portion only of said further circuit means for controlling the state, superconductive or normal, of said portion only and thereby controlling the transmission of signals between said first and third conductors.

3. The device of claim 2 wherein said portion of said further circuit means is physically remote from said second conductor.

4. The device of claim 2 wherein said first, second and third conductors are coaxially arranged cylindrical conductors and said further circuit means includes a fourth coaxial cylindrical conductor arranged around said first cylindrical conductor.

5. A switching device comprising a first conductor fabricated of superconductor material and maintained at an operating temperature at which it is in a superconductive state, means connected to said first conductor for producing a current therein, means for controlling the state, superconductive or normal, of said first conductor comprising second and third superconductive conductors, means connected thereto for producing therein currents in a direction opposite to that of said current in said first conductor, whereby magnetic fields applied to said first conductor due to currents in said second and third conductors are in the same direction and oppose self-magnetic fields applied to said first conductor due to said current in said first conductor, wherein said first, second, and third conductors are thin planar conductors.

6. A switching device comprising a gate conductor, a bias conductor, a control conductor, each of said conductors being fabricated of superconductive material and maintained at a temperature below its transition temperature, means for supplying bias current to said bias conductor to cause said gate conductor to be subjected to a biasing magnetic field, means for supplying gate current to said gate conductor in a direction such that it generates a magnetic field opposing said bias magnetic field, means for supplying to said control conductor current in a direction such that it generates a magnetic field aiding said biasing field whereby the current required in said gate conductor to cause the gate conductor to be driven resistive when there is bias current in said bias conductor is greater than the current required in said control conductor to cause the gate conductor to be driven resistive when there is no bias current in said bias conductor, wherein said control conductor comprises a first planar layer of superconductor material, said bias conductor comprises second and third layers of superconductive material one on each side of said first layer, said gate conductor comprising fourth and fifth planar layers of superconductive material one on each side of said first layer and separated from said first layer by said second and third layers, said planar layers being disposed in parallel spaced relationship and the respective widths thereof being large compared to the respective spacings therebetween.

7. A switching device comprising a gate and a control conductor means of superconductive material maintained at a temperature at which each is superconductive in the absence of a magnetic field, means connected to said gate conductor means for producing longitudinal current therein, said longitudinal current producing a magnetic field only at one surface of said gate conductor means, said control conductor means arranged adjacent the other surface of said gate conductor means for applying thereto magnetic fields effective to control the state, superconductive or normal, of said gate conducting means regardless of the presence or absence of current therein, wherein said gate conductor means comprises first and second planar layers of superconductive material disposed in parallel spaced relationship, and said control conductor means comprises at least one planar layer of superconductive material disposed in parallel relationship to said first and second layers and arranged between said first and second layers.

8. A gating device comprising, a superconductor gate means comprising first and second planar superconductor conductors extending in parallel spaced relationship; superconductor control conductor means for controlling the state of said gate means; said superconductor control means comprising third and fourth planar conductors extending in parallel spaced relationship and arranged between said first and second planar conductors of said gate means; means connected to said first and second planar conductors for applying a current to be gated thereto; and means connected to said third and fourth planar conductors for supplying thereto current for controlling the state, superconductive or normal, of said first and second planar conductors.

9. The device of claim 8 wherein there is provided further superconductor control means comprising a fifth planar conductor extending in parallel spaced relationship with said third and fourth parallel conductors in the space between said third and fourth planar conductors.

10. A gating device comprising superconductor control means and superconductor gate means maintained at a superconductive temperature; said superconductor gate means comprising first and second planar superconductor conductors extending in parallel spaced relationship; said superconductor control means comprising first and second control conductor means; said first control conductor means comprising third and fourth planar conductors extending in parallel spaced relationship in the space between said first and second planar conductors of said gate means; said second control conductor means comprising a fifth planar conductor extending in the space between said third and fourth conductors of said first control conductor means; and means connected to one of said control conductor means for applying bias current thereto and to the other of said control conductor means for applying control signals thereto.

11. The device of claim 10 wherein said first, second, third, fourth and fifth planar conductors extend longitudinally in the same direction, so that a longitudinal current in any one thereof produces a magnetic field at right angles to the direction in which the conductors extend.

12. A superconductor device comprising a substrate; first, second, third, fourth and fifth superconductor conductors mounted on said substrate in that order one above the other with layers of insulating material therebetween; means connected to said first and fifth superconductors for supplying a current to be gated thereto; and means for controlling the state, superconductive or normal, of said first and fifth conductors comprising first means connected to said second and fourth conductors for supplying current thereto and second means connected to said third conductor for supplying current thereto.

13. The device of claim 12 wherein each of said conductors extend longitudinally one above the other in the same direction.

14. In a superconductor gating device of the type including a superconductor gate element and a superconductor control element wherein the state of the gate element, superconductive or normal, is controlled by current applied to the control element; first, second, and third planar superconductor conductors extending longitudinally in the same direction one above the other; means connected to said conductors for producing longitudinal current therein so that a current in any one thereof produces a magnetic field in a direction at right angles to the direction in which said conductors extend; two of said conductors being connected together to form one of said elements of said gating device and the other of said conductors forming the other element of said gating device.

References Cited by the Examiner

UNITED STATES PATENTS

| | | | |
|---|---|---|---|
| 2,666,884 | 1/1954 | Ericsson et al. | 307—88.5 |
| 2,832,897 | 4/1958 | Buck | 307—88 |
| 2,914,735 | 11/1959 | Young | 332—51 |

OTHER REFERENCES

Crowe, I.B.M. Journal—"Trapped-Flux Superconducting Memory," October 1957, pp. 300 (FIG. 7).

ARTHUR GAUSS, *Primary Examiner.*

GEORGE N. WESTBY, ORIS L. RADER, G. G. JENSEN, S. A. ROEN, J. S. HEYMAN, *Assistant Examiners.*